(12) United States Patent
Lefevre et al.

(10) Patent No.: US 11,764,902 B2
(45) Date of Patent: Sep. 19, 2023

(54) FORWARD ERROR CORRECTION CONTROL

(71) Applicant: Nokia Solutions and Networks Oy, Espoo (FI)

(72) Inventors: Yannick Lefevre, Kessel Lo (BE); Adriaan de Lind van Wijngaarden, New Providence, NJ (US); Jochen Maes, Antwerp (BE); Vincent Houtsma, New Providence, NJ (US); Doutje Van Veen, New Providence, NJ (US); Amitkumar Mahadevan, Edison, NJ (US); Michaël Fivez, Antwerp (BE)

(73) Assignee: Nokia Solutions and Networks Oy, Espoo (FI)

( * ) Notice: Subject to any disclaimer, the term of this patent is extended or adjusted under 35 U.S.C. 154(b) by 7 days.

(21) Appl. No.: 17/470,293

(22) Filed: Sep. 9, 2021

(65) Prior Publication Data

US 2022/0123863 A1     Apr. 21, 2022

Related U.S. Application Data

(60) Provisional application No. 63/092,473, filed on Oct. 15, 2020.

(51) Int. Cl.
  *H04L 1/00* (2006.01)
  *H03M 13/00* (2006.01)
  (Continued)

(52) U.S. Cl.
  CPC ...... *H04L 1/0068* (2013.01); *H03M 13/6362* (2013.01); *H04B 10/516* (2013.01);
  (Continued)

(58) Field of Classification Search
  CPC ... H04L 1/0068; H04L 1/0041; H04L 1/0045; H03M 13/6362; H04B 10/516; H04B 10/60
  See application file for complete search history.

(56) References Cited

U.S. PATENT DOCUMENTS

| 9,893,838 B2 | 2/2018 | Arunarthi | |
| 2014/0181616 A1* | 6/2014 | Arunarthi | H04L 7/0337 714/755 |
| 2020/0382241 A1* | 12/2020 | Liu | H04L 1/0041 |

FOREIGN PATENT DOCUMENTS

WO   WO 2017/113349 A1   7/2017

OTHER PUBLICATIONS

EP Search Report mailed in corresponding EP 21199392.8 dated Mar. 3, 2022, 7 pages.

(Continued)

*Primary Examiner* — Samir W Rizk
(74) *Attorney, Agent, or Firm* — Tong, Rea, Bentley & Kim, LLC

(57) ABSTRACT

Various example embodiments for supporting forward error correction (FEC) in a communication system are presented. Various example embodiments for supporting FEC in a communication system may include the selection of a FEC setting for a communication channel from a transmitter to a receiver, e.g., the selection of a FEC setting for a communication channel, the selection of a FEC setting for a data burst sent over a communication channel, the selection of a FEC setting for a portion of a data burst sent over a communication channel, switching between FEC settings for different portions of a data burst over a communication channel, or the like, as well as various combinations thereof.

19 Claims, 10 Drawing Sheets

DATA BURST
STRUCTURE
600

(51) Int. Cl.
 *H04B 10/516* (2013.01)
 *H04B 10/60* (2013.01)
(52) U.S. Cl.
 CPC .......... *H04B 10/60* (2013.01); *H04L 1/0041* (2013.01); *H04L 1/0045* (2013.01)

(56) References Cited

OTHER PUBLICATIONS

IEEE Standards Association, "IEEE Standard for Ethernet—Amendment 9: Physical Layer Specifications and Management Parameters for 25 Gb/s and 50 Gb/s Passive Optical Networks," IEEE P802.3ca-2020, Jul. 3, 2020, 267 pages.
International Telecommunication Union, "HSP Upstream LDPC Scheme," SG15-C, ITU-T Q2 Conference Call, Jul. 6-10, 2020, 5 pages.
International Telecommunication Union, "Improved LDPC Design for 50G-PON Burst-Mode Upstream Transmission," SG15-C1208, ITU-T Meeting, Geneva, Jul. 1-12, 2019, 5 pages.
Yang, et al., "Real-Time Verification of Soft-Decision LDPC Coding for Burst Mode Upstream Reception in 50G-PON," Journal of Lightwave Technology, vol. 38, No. 7, Apr. 1, 2020, pp. 1693-1701.
International Telecommunication Union, "Summary of Bit-Interleaving Impact on 50G Hard-Input LDPC Performance with Measured Data," SG15-C2259, ITU-T Virtual Plenary, Geneva, Sep. 7-18, 2020, 7 pages.

\* cited by examiner

*FIG. 3*

PARITY CHECK MATRIX 300

$$H = \begin{matrix} & d_1 & d_2 & d_3 & d_4 & d_5 & p_1 & p_2 & p_3 & p_4 \\ c_1 & 0 & 0 & 1 & 0 & 1 & 1 & 0 & 0 & 0 \\ c_2 & 1 & 0 & 1 & 1 & 0 & 0 & 1 & 0 & 0 \\ c_3 & 0 & 1 & 0 & 1 & 0 & 1 & 0 & 1 & 0 \\ c_4 & 1 & 1 & 0 & 0 & 1 & 0 & 0 & 0 & 1 \end{matrix}$$

$$H_{compact} = \begin{bmatrix} 35 & 19 & 41 & 22 & 40 & 41 & 39 & 6 & 28 & 18 & 17 & 3 & 28 & -1 & -1 & -1 \\ 29 & 30 & 0 & 8 & 33 & 22 & 17 & 4 & 27 & 28 & 20 & 27 & 24 & 23 & -1 & -1 \\ 37 & 31 & 18 & 23 & 11 & 21 & 6 & 20 & 32 & 9 & 12 & 29 & -1 & 0 & 13 & -1 \\ 25 & 22 & 4 & 34 & 31 & 3 & 14 & 15 & 4 & -1 & 14 & 18 & 13 & 13 & 22 & 24 \end{bmatrix}$$

PARITY CHECK MATRIX 400

BURST_PROFILE MESSAGE 700

| Octet | Content | Description |
|---|---|---|
| 1-2 | ONU-ID | Directed message to one ONU or broadcast message to all ONUs. As a broadcast to all ONUs, ONU-ID = 0x03FF represents the Burst_Profile message for all ONUs that support 2.48832 Gbit/s upstream line rate and for all ONUs that support 9.95328 Gbit/s upstream line rate. ONU-ID = 0x03FE represents the Burst_Profile message for all ONUs that support 9.95328 Gbit/s upstream line rate. (See Appendix II, Section "FOR Annex C.11" for detailed discussion) |
| 3 | Message type ID | 0x01, "Burst_Profile". |
| 4 | SeqNo | Eight-bit unicast or broadcast PLOAM sequence number, as appropriate. |
| 5 | Burst profile control | An octet of the form VVVV 0FPP, where: VVVV – Four-bit profile version. If the content of the profile changes, the OLT should ensure that the version also changes, so that the ONU can detect updates solely on the basis of the version field. F – Applicability of the message to specific upstream line rates: F = 0: The profile applies to ONUs transmitting at 2.48832 Gbit/s upstream line rate; F = 1: The profile applies to ONUs transmitting at 9.95328 Gbit/s upstream line rate. PP – Two-bit burst profile index. |
| 6 | Upstream FEC indication | 0000 000F, where: F = 1: FEC on; F = 0: FEC off. |
| 7 | Delimiter length | 0000 DDDD, where. DDDD – Delimiter length in octets; four-bit integer, range 0–8. |
| 8-15 | Delimiter | Aligned with the most significant end of the field; padded with 0x00, padding treated as "don't care" by the receiver. |
| 16 | Preamble length | 0000 LLLL, where: LLLL – Preamble length in octets; four-bit integer, range 1–8. |
| 17 | Preamble repeat count | 000P PPPP when F = 0; PPPP when F = 1. The value 0 specifies that no preamble is transmitted. |
| 18-25 | Preamble pattern | Preamble pattern, aligned with the most significant end of the field; padded with 0x00; padding treated as "don't care" by the receiver. |
| 26-33 | PON-TAG | An 8-byte static attribute of the OLT that is chosen by the operator and is used to bind the master session key (MSK) to the context of the security association (see clause C.15.3.3). Unless the profile version is incremented, PON-TAG is the same for Burst_Profile messages with all profile indices transmitted by the OLT. It is good practice to ensure that PON-TAG is unique within at least the operator's domain and fixed for the lifetime of the system. |
| 34-40 | Padding | Set to 0x00 by the transmitter; treated as "don't care" by the receiver. |
| 41-48 | MIC | Message integrity check, computed using the default PLOAM_IK in case of broadcast message, and using the ONU-specific derived shared PLOAM_IK in case of directed message. |

FIG. 8
DOWNSTREAM FS FRAME FORMAT 800
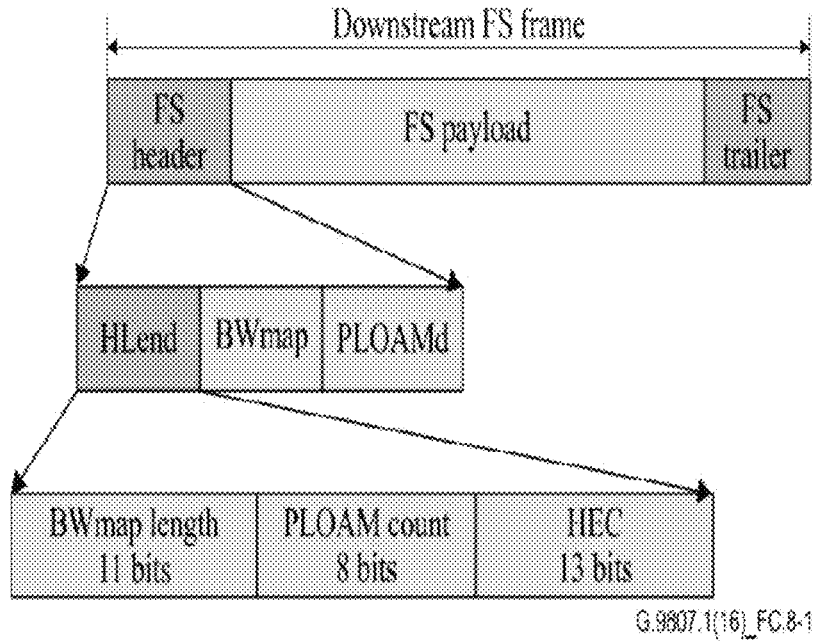
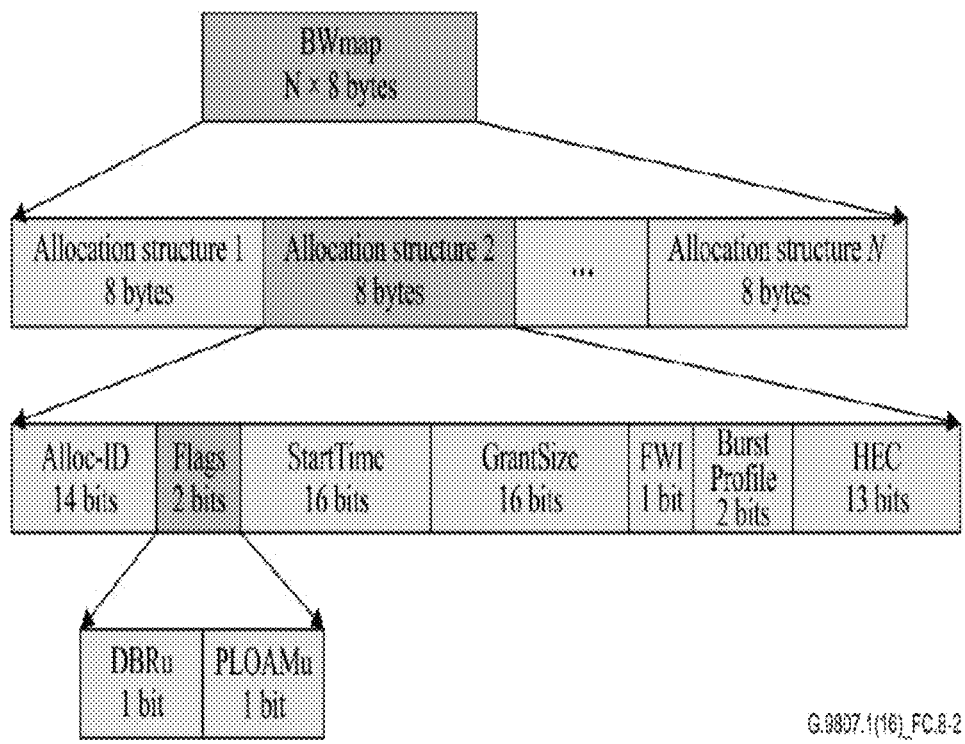

FORWARD ERROR CORRECTION CONTROL

CROSS-REFERENCE TO RELATED APPLICATIONS

This application claims the benefit of U.S. Provisional Application Ser. No. 63/092,473, filed Oct. 15, 2020, which is hereby incorporated by reference herein in its entirety.

TECHNICAL FIELD

Various example embodiments relate generally to communication systems and, more particularly but not exclusively, to supporting forward error correction (FEC) in communication systems.

BACKGROUND

Forward error correction (FEC) may be used in various communication contexts in order to support improved communications over communication networks.

SUMMARY

In at least some example embodiments, an apparatus includes at least one processor and at least one memory including computer program code, wherein the at least one memory and the computer program code are configured, with the at least one processor, to cause the apparatus to at least support communication of a message configured to cause a transmitter of a data burst to use a first forward error correction setting for encoding a first portion of the data burst and to use a second forward error correction setting for encoding a second portion of the data burst, wherein the second forward error correction setting is different than the first forward error correction setting. In at least some example embodiments, a non-transitory computer readable medium includes computer program code configured to cause an apparatus to at least support communication of a message configured to cause a transmitter of a data burst to use a first forward error correction setting for encoding a first portion of the data burst and to use a second forward error correction setting for encoding a second portion of the data burst, wherein the second forward error correction setting is different than the first forward error correction setting. In at least some example embodiments, a method includes supporting communication of a message configured to cause a transmitter of a data burst to use a first forward error correction setting for encoding a first portion of the data burst and to use a second forward error correction setting for encoding a second portion of the data burst, wherein the second forward error correction setting is different than the first forward error correction setting. In at least some example embodiments, an apparatus includes means for supporting communication of a message configured to cause a transmitter of a data burst to use a first forward error correction setting for encoding a first portion of the data burst and to use a second forward error correction setting for encoding a second portion of the data burst, wherein the second forward error correction setting is different than the first forward error correction setting. In at least some example embodiments, the message includes at least one of an indication of the first forward error correction setting or an indication of the second forward error correction setting. In at least some example embodiments, the message includes one or more of at least one of an indication of a location of the first portion of the data burst or a location of the second portion of the data burst, at least one of an indication of a length of the first portion of the data burst or a length of the second portion of the data burst, or at least one of an indication of a number of codewords of the first portion of the data burst or a number of codewords of the second portion of the data burst. In at least some example embodiments, the message is configured to enable the transmitter to compute information indicative of at least one of a location of the first portion of the data burst or a location of the second portion of the data burst. In at least some example embodiments, the message includes forward error correction setting control information. In at least some example embodiments, the forward error correction setting control information is indicative that the first forward error correction setting is to be used for the first portion of the data burst and that the second forward error correction setting is to be used for the second portion of the data burst. In at least some example embodiments, the forward error correction setting control information is configured to cause the transmitter to switch from using the first forward error correction setting to using the second forward error correction setting, and the message includes an indication of a location within the data burst at which the transmitter is to switch from using the first forward error correction setting to using the second forward error correction setting. In at least some example embodiments, the message is included in a framing sublayer (FS) frame. In at least some example embodiments, the message is a burst profile message. In at least some example embodiments, the message is a Physical Layer Operation and Management (PLOAM) message or an Optical Network Unit (ONU) Management and Control Interface (OMCI) message. In at least some example embodiments, the burst profile message is a Burst_Profile Physical Layer Operation and Management (PLOAM) message or an Optical Network Unit (ONU) Management and Control Interface (OMCI) message. In at least some example embodiments, the first forward error correction setting is indicative of a first code rate and the second forward error correction setting is indicative of a second code rate. In at least some example embodiments, the first forward error correction setting and the second forward error correction setting are based on a forward error correction parameter for a forward error correction mother code. In at least some example embodiments, the forward error correction parameter for the forward error correction mother code includes at least one of an amount of puncturing for the forward error correction mother code or an amount of shortening for the forward error correction mother code. In at least some example embodiments, at least one of the first forward error correction setting or the second forward error correction setting includes information to determine a new forward error correction code. In at least some example embodiments, the message is configured to cause the transmitter to use a third forward error correction setting for encoding a third portion of the data burst. In at least some example embodiments, communication of the first portion of the data burst encoded based on the first forward error correction setting is supported and communication of the second portion of the data burst encoded based on the second forward error correction setting is supported. In at least some example embodiments, support for communication of the message may include receiving, by the transmitter of the data burst from a receiver of the data burst or a controller, the message or sending, by a receiver of the data burst toward the transmitter of the data burst, the message. In at least some example embodiments, the transmitter includes an optical network unit (ONU) and an associated receiver includes an optical line terminal (OLT), and the ONU and the OLT are associated with a passive optical network (PON).

BRIEF DESCRIPTION OF THE DRAWINGS

The teachings herein can be readily understood by considering the following detailed description in conjunction with the accompanying drawings, in which:

FIG. 3 depicts an example of a parity check matrix of a low-density parity check (LDPC) code;

FIG. 4 depicts an example of a compact representation of a parity check matrix of a quasi-cyclic (QC) QC LDPC code;

FIG. 7 depicts an example of a burst profile message which may be modified or enhanced to support intra-burst FEC switching;

FIG. 8 depicts a downstream framing sublayer (FS) frame format and header field and a bandwidth map (BWmap) partition and the format of an allocation structure;

To facilitate understanding, identical reference numerals have been used herein, wherever possible, in order to designate identical elements that are common among the various figures.

DETAILED DESCRIPTION

Figure 1:
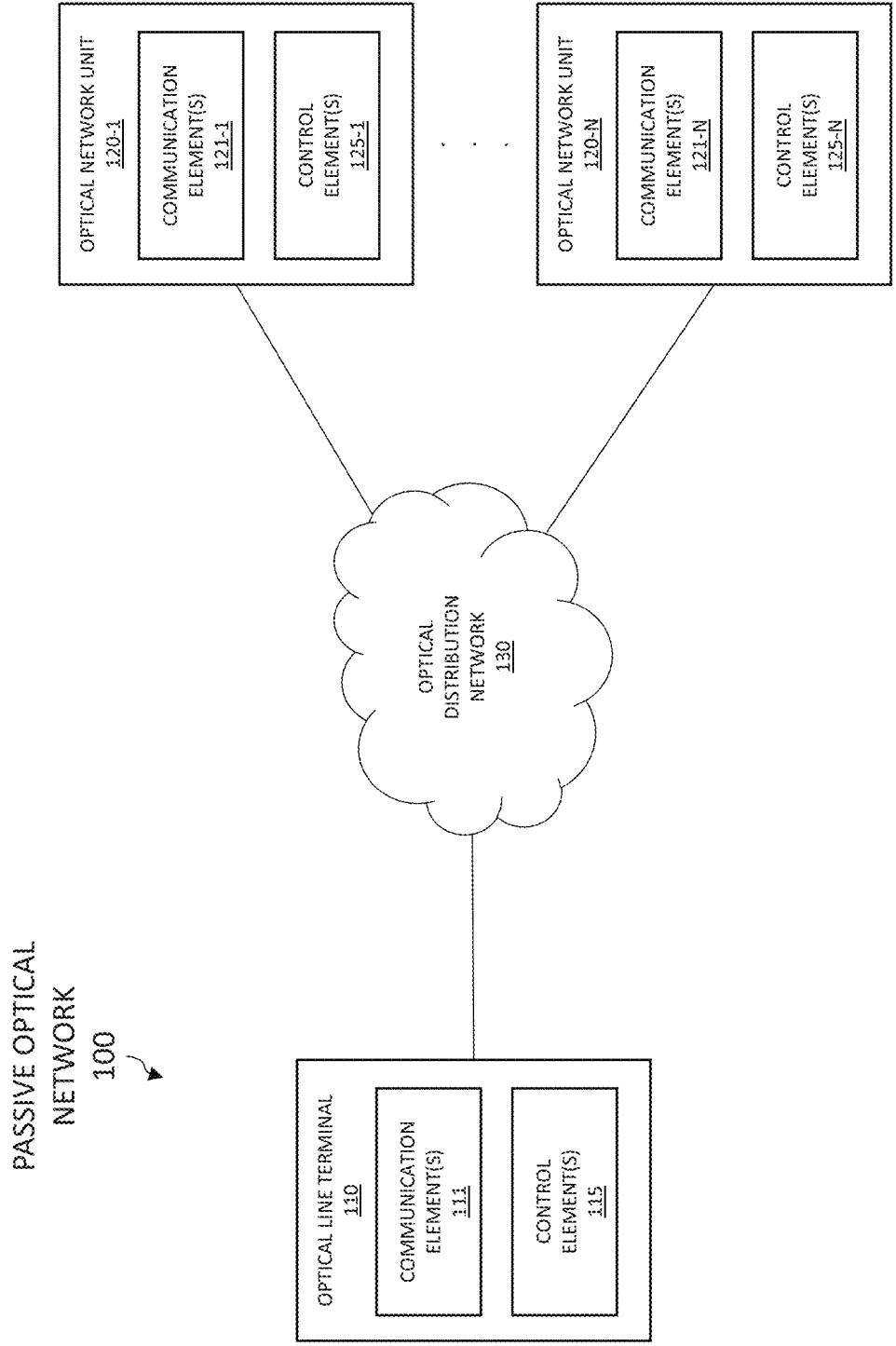
FIG. 1 depicts an example embodiment of a passive optical network (PON) configured to support forward error correction (FEC) for communication channels.

Various example embodiments for supporting forward error correction (FEC) in a communication system are presented.

Various example embodiments for supporting FEC in a communication system may include the selection of a FEC setting for a communication channel from a transmitter to a receiver, e.g., the selection of a FEC setting for a communication channel, the selection of a FEC setting for a data burst sent over a communication channel, the selection of a FEC setting for a portion of a data burst sent over a communication channel, switching between FEC settings for different portions of a data burst over a communication channel, or the like, as well as various combinations thereof.

Various example embodiments for supporting FEC in a communication system may include selection of a FEC setting for a communication channel from a transmitter to a receiver based on channel characteristics information of the communication channel from the transmitter to the receiver. The selection of the FEC setting may include determining a setting for a current FEC code that is currently being used for communications over the communication channel, e.g., applying an amount of puncturing of a selected FEC code, an amount of shortening of a selected FEC code, or the like, as well as various combinations thereof, as such specifying the FEC code to be used for communications over the communication channel, or the like, as well as various combinations thereof. The channel characteristics information of the communication channel which may be used for selection of the FEC setting for the communication channel may include one or more of transfer function information, channel loss information, noise characteristic information, error information (e.g., bit error rate (BER), error modeling information (e.g., information indicative of a received error-cluster distribution, information indicative of error-free run distributions, or the like), or the like, as well as various combinations thereof), or the like, as well as various combinations thereof.

Various example embodiments for supporting FEC in a communication system may include selection of at least one FEC setting for a data burst on a communication channel, e.g., the selection of a FEC setting for a data burst on a communication channel, selection of a FEC setting for a portion of a data burst on a communication channel, switching between FEC settings for different portions of a data burst on a communication channel, or the like, as well as various combinations thereof. Various example embodiments for supporting FEC in a communication system may include supporting intra-burst FEC switching for communications on a communication channel. Various example embodiments for supporting FEC in a communication system may include supporting intra-burst FEC switching for communications on a communication channel by supporting use of different FEC codes for transmitting different portions of a data burst on the communication channel. Various example embodiments for supporting FEC in a communication system may include supporting intra-burst FEC switching for communications on a communication channel, by supporting use of different FEC codes for transmitting different portions of a data burst on the communication channel, based on use of messaging between the endpoints of the communication channel for controlling switching between FEC codes within data bursts between the endpoints on the communication channel.

Various example embodiments for supporting FEC in a communication system, based on selection of a FEC setting for a communication channel may be applied within various types of communication systems including various types of wired communication systems (e.g., fiber networks (e.g., Passive Optical Networks (PONs), point-to-point (P2P) fiber networks, or the like), Ethernet networks, Digital Subscriber Line (DSL) networks, cable networks (e.g., DOCSIS 3.1, DOCSIS 3.1 FDX, or the like), powerline communication networks (e.g., G.hn or the like), or the like, as well as various combinations thereof) or various types of wireless communication systems (e.g., cellular networks (e.g., Fourth Generation (4G), 4G Long Term Evolution (LTE), Fifth Generation (5G), or the like), WiFi networks, WiMAX networks, satellite networks, or the like, as well as various combinations thereof); however, for purposes of clarity, various example embodiments for supporting FEC in a communication system are primarily presented herein within the context of a PON and, more particularly, within the context of supporting FEC between an optical line terminal (OLT) and an optical network unit (ONU) via a communication channel in an optical distribution network (ODN) of the PON (e.g., downstream from OLT to ONU or upstream from ONU to OLT). Various example embodiments for supporting FEC between an OLT and an ONU in a PON may be configured to support ONU-specific FEC for the ONUs connected to an OLT, such that different FEC settings may be used by different ONUs connected to the same OLT.

It will be appreciated that these and various other example embodiments and advantages or potential advantages of supporting selection of a FEC setting for a communication channel from a transmitter to a receiver may be further understood by way of reference to the various figures, which are discussed further below.

FIG. 1 depicts an example embodiment of a PON configured to support FEC for communication channels.

The PON 100 may be a system for providing network access to a set of customers. For example, the PON 100 may provide network access over "the last mile" (e.g., the final portion of a telecommunications network that delivers communications to and supports communications of the customers). For example, the PON 100 may operate as a point-to-multipoint (P2MP) data distribution system. It will be appreciated that the PON 100 may be one or more of various types of PONs, such as a time-division multiplexing PON (e.g., a gigabit-capable PON (GPON), an Ethernet PON (EPON), or the like), a wavelength-division multiplexing (WDM) PON, a time-and-wavelength-division (TWDM) PON (e.g., a Next-Generation Passive Optical Network (NG-PON), a Next-Generation Passive Optical Network 2 (NG-PON2), or the like), an orthogonal frequency division multiplexed (OFDM) PON, or the like, as well as various combinations thereof.

The PON 100 includes an optical line terminal (OLT) 110 and a set of optical network units (ONUs) 120-1-120-N (collectively, ONUs 120) connected via an optical distribution network (ODN) 130. The PON 100 may be configured to support downstream (DS) communications from the OLT 110 to the ONUs 120 via the ODN 130 and upstream (US) communications from the ONUs 120 to the OLT 110 via the ODN 130. It will be appreciated that the PON 100 may include various other elements which have been omitted for purposes of clarity.

The OLT 110 is configured to support communications between the ONUs 120 and one or more upstream networks (omitted for purposes of clarity). The OLT 110 may be located in a central location, such as a central office (CO) or other suitable location. For example, the one or more upstream networks may include one or more core communication networks configured to support communications of the OLT 110 and, thus, of the ONUs 120. For example, the OLT 110 may be configured to forward data received from the one or more upstream networks downstream toward the ONUs 120 via the ODN 130 and to forward data received from the ONUs 120 via the ODN 130 upstream toward the one or more upstream networks. The OLT 110 may include one or more communication elements 111 configured to support communications between the OLT 110 and the ONUs 120, including one or more transmission elements (e.g., an encoder, a transmitter, and the like) for DS communications to the ONUs 120 and one or more reception elements (e.g., a receiver, a decoder, and the like) for US communications from the ONUs 120. The OLT 110 may include one or more control elements 115 configured to control various aspects of communications between the OLT 110 and the ONUs 120, including one or more transmission controllers (e.g., an encoder controller or other controller), one or more reception controllers (e.g., a decoder controller or the like), and the like, as well as various combinations thereof. The OLT 110, including various components of the OLT 110 (e.g., communication elements 111, control elements 115, and the like) may be configured to support various functions for supporting FEC within the PON 100). It will be appreciated that the OLT 110 may include various other elements for supporting communications with the ONUs 120, for supporting FEC for communications between the OLT 110 and the ONUs 120, and the like, as well as various combinations thereof.

The ONUs 120 each are configured to support communications between the OLT 110 and one or more downstream networks or devices (omitted for purposes of clarity). The ONUs 120 may be located at respective user premises or other suitable locations. For example, the one or more downstream networks or devices for an ONU 120 may include one or more local area networks (LANs) of the customer, one or more communication devices of the customer (e.g., a modem, a router, a switch, a set top box, a smart television, a gaming system, a computer, a smartphone, or the like, as well as various combinations thereof). For example, an ONU 120 may be configured to forward data received from the OLT 110 via the ODN 130 downstream toward one or more downstream networks or devices and to forward data received from the one or more downstream networks or devices upstream toward the OLT 110 via the ODN 130. The ONUs 120 each may include one or more communication elements 121 (depicted as communication elements 121-1-121-N (collectively, communication elements 121) of ONUs 120-1-120-N, respectively) configured to support communications between the ONUs 120 and the OLT 110, including one or more transmission elements (e.g., an encoder, a transmitter, and the like) for US communications to the OLT 110 and one or more reception elements (e.g., a receiver, a decoder, and the like) for DS communications from the OLT 110. The ONUs 120 each may include one or more control elements 125 (depicted as control elements 125-1-125-N (collectively, control elements 125) of ONUs 120-1-120-N, respectively) configured to control various aspects of communications between the ONUs 120 and the OLT 110, including one or more transmission controllers (e.g., an encoder controller or other controller), one or more reception controllers (e.g., a decoder controller or the like), and the like, as well as various combinations thereof. The ONUs 120, including various components of the ONUs 120 (e.g., communication elements 121, control elements 125, and the like) may be configured to support various functions for supporting FEC within the PON 100). It will be appreciated that each of the ONUs 120 may include various other elements for supporting communications with the OLT 110, for supporting FEC for communications between the ONUs 120 and the OLT, and the like, as well as various combinations thereof.

The ODN 130 may be a data distribution system configured to support communications between the OLT 110 and the ONUs 120. The ODN 130 is depicted as being arranged in a branching configuration; however, it will be appreciated that various other P2MP configurations may be used. The ODN 130 may include various passive optical components (e.g., optical fibers, couplers, splitters, and the like) which do not require power to distribute data signals between the OLT 110 and the ONUs 120; however, it will be appreciated that the ODN 130 also may include active components (e.g., optical amplifiers and the like). It will be appreciated that the ODN 130 may include various other elements for supporting communications between the OLT 110 and the ONUs 120.

The PON 100 is configured to support FEC for communications between the OLT 110 and the ONUs 120. The PON 100 may be configured to support selection of a FEC setting for a communication channel between the OLT 110 and an ONU 120 based on channel characteristic information of the communication channel between the OLT 110 and the ONU 120. The communication channel may be a DS channel from the OLT 110 to the ONU 120 or an US channel from the ONU 120 to the OLT 110.

The selection of the FEC setting for the communication channel between the OLT 110 and the ONU 120 may be performed for various types of FEC codes. For example, the selection of the FEC setting for the communication channel between the OLT 110 and the ONU 120 may be performed for low density parity check (LDPC) codes, Reed-Solomon codes, binary convolution codes, Hamming codes, or the like, as well as various combinations thereof. It will be appreciated that, although primarily present herein with respect to example embodiments in which the FEC code is an LDPC code, various example embodiments presented herein may use, or be adapted to use, various other types of FEC codes.

The selection of the FEC setting for the communication channel between the OLT 110 and the ONU 120, as indicated above, may be performed for an LDPC code. In general, an LDPC code is a block code that takes K information bits and encodes them into a codeword of N bits. Typically, the K information bits appear unchanged in the codeword and N−K parity bits are added; in this case the code is also systematic). The code rate of an LDPC code is R=K/N, and its characteristics are fully described by an (N−K)×N parity check matrix H. The N columns of H correspond to the bits of the LDPC codeword, with the first K bits corresponding to information (data) bits $d_i$ and the last (N−K) bits corresponding to the parity bits $p_i$. The N−K rows correspond to the check constraints that any valid codeword of the LDPC code should satisfy: namely that the XOR-sum of all the bits indicated in the row has to be 0. This can be formally expressed as (a sum followed by a modulo-2 operation equivalent to an XOR-sum): mod(H.c,2)=0, where c is the column vector of the data bits d and the parity bits p. Contemporary LDPC codes are typically quasi-cyclic (QC) codes. The parity check matrix of such a code can be subdivided into Z×Z sub-matrices in which each sub-matrix is either a rotated identity matrix or an all zero matrix. Here, Z is often called the lifting factor. The parity check matrix of a QC code can be represented using a compact matrix $H_{compact}$ in which −1 indicates an all-zero Z×Z sub-matrix, and any other element m indicates an identity sub-matrix, the rows of which have been circularly shifted right by m positions. The advantage of QC LDPC codes is that they can be specified using a very compact matrix representation, and that they inherently allow parallelization, which is indicated by the fact that each of the Z check constraints in a row of $H_{compact}$ are the same constraint, but applied to a different set of (independent) bits. Again, it will be appreciated that, although primarily present herein with respect to example embodiments in which the FEC code is an LDPC code, various example embodiments presented herein may use, or be adapted to use, various other types of FEC codes.

The selection of the FEC setting for the communication channel between the OLT 110 and the ONU 120 may be performed in various ways. In at least some example embodiments, for example, the selection of the FEC setting for the communication channel between the OLT 110 and the ONU 120 may include determining a setting for a current FEC code currently being used for communications on the communication channel between the OLT 110 and the ONU 120 (e.g., an amount of puncturing of the current FEC code, an amount of shortening of the current FEC code, or the like, as well as various combinations thereof). It will be appreciated that the selection of the FEC setting for the communication channel between the OLT 110 and the ONU 120 may take into account the tradeoff between user bit-rate (FEC overhead) and link conditions where it will be appreciated that an increase in puncturing may result in an increase in throughput but a decrease in the error correcting capabilities of the code whereas an increase in shortening may result in a decrease in throughput but an increase in the error correcting capabilities. In at least some example embodiments, for example, the selection of the FEC setting for the communication channel between the OLT 110 and the ONU 120 may include determining a new FEC code to be used for communications on the communication channel (e.g., a new LDPC matrix), or the like, as well as various combinations thereof. It will be appreciated that the determination of the FEC setting for the communication channel between the OLT 110 and the ONU 120 may depend on the type of FEC code being used or other factors.

The selection of the FEC setting for the communication channel between the OLT 110 and the ONU 120 based on the channel characteristic information of the communication channel between the OLT 110 and the ONU 120 may be based on various types of channel characteristic information which may be collected in various ways. For example, the channel characteristics information of the communication channel between the OLT 110 and the ONU 120 which may be used as a basis for selecting the FEC setting for the communication channel between the OLT 110 and the ONU 120 may include one or more of transfer function information, channel loss information, noise characteristic information, error information (e.g., bit error rate (BER), error modeling information (e.g., information indicative of a received error-cluster distribution (ECD), information indicative of error-free run distributions (EFRD), or the like), or the like, as well as various combinations thereof), or the like, as well as various combinations thereof. It will be appreciated that various other types of channel characteristic information of the communication channel between the OLT 110 and the ONU 120 may be used as a basis for selection of the FEC setting for the communication channel between the OLT 110 and the ONU 120.

The selection of the FEC setting for the communication channel between the OLT 110 and the ONU 120 also (e.g., in addition to channel characteristics) or alternatively (e.g., in place of channel characteristics) may be based on one or more of one or more boundary conditions, one or more communication element capabilities (e.g., a transmitter capability of the transmitter of the communication channel between the OLT 110 and the ONU 120, a receiver capability of the receiver of the communication channel between the OLT 110 and the ONU 120, or the like, as well as various combinations thereof), or the like, as well as various combinations thereof).

The selection of the FEC setting for the communication channel may be performed by OLT 110 (e.g., and the FEC setting that is selected, or at least an indication thereof, may be communicated by the OLT 110 to the ONU 120), by the ONU 120 (e.g., and the FEC setting that is selected, or at least an indication thereof, may be communicated by the ONU 120 to the OLT 110), by an entity on behalf of the OLT 110 and the ONU 120 (e.g., and the FEC setting that is selected, or at least an indication thereof, may be communicated to the OLT 110 and the ONU 120), or the like, as well as various combinations thereof.

The indication of the FEC setting selected for the communication channel may be provided to the OLT 110 and the ONU 120 in various ways. The indication of the FEC setting selected for the communication channel may be provided to the OLT 110 and the ONU 120 using various types of signaling or messaging (e.g., using in-band (IB) signaling or messaging, using out-of-band (OOB) signaling or messaging, using various message types, using various types of indicators or information, or the like, as well as various combinations thereof). The indication of the FEC setting, where the selection of the FEC setting for the communication channel is performed by OLT 110, may be considered to be provided to the OLT 110 by virtue of the fact that the OLT 110 has selected the FEC setting, may be considered to be provided to the OLT 110 via some internal messaging between components of the OLT 110, may be provided to the ONU 120 via IB or OOB messaging, or the like, as well as various combinations thereof. The indication of the FEC setting, where the selection of the FEC setting for the communication channel is performed by ONU 120, may be considered to be provided to the ONU 120 by virtue of the fact that the ONU 120 has selected the FEC setting, may be considered to be provided to the ONU 120 via some internal messaging between components of the ONU 120, may be provided to the OLT 110 via IB or OOB messaging, or the like, as well as various combinations thereof. The indication of the FEC setting, where the selection of the FEC setting for the communication channel is performed by an element other than the OLT 110 or the ONU 120, may be provided to the OLT 110 via messaging from the element to the OLT 110, may be provided to the ONU 120 via messaging from the element to the ONU 120, may be provided to the ONU 120 via messaging from the element to the OLT 110 that is then signaled from the OLT 110 to the ONU 120, may be provide to the OLT 110 via messaging from the element to the ONU 120 that is then signaled from the ONU 120 to the OLT 110, or the like, as well as various combinations thereof. The indication of the FEC setting may be communicated using various message types, such as Physical Layer Operation Administrations and Management (PLOAM) messages, ONU Management and Control Interface (OMCI) messages, or the like, as well as various combinations thereof.

It will be appreciated that various example embodiments discussed above related to the configuration of the PON 100 to support FEC for communications between the OLT 110 and the ONUs 120 may be further understood by further considering the DS direction of transmission within the PON 100 and the US direction of transmission within the PON 100, as discussed further below.

The PON 100 may be configured to support DS FEC for DS communications from the OLT 110 to the ONUs 120. It will be appreciated that, as discussed further below, support for DS FEC for DS communications from the OLT 110 to an ONU 120 may by controlled by the OLT 110 (or an element included within or in communication with the OLT 110), may be controlled by the ONU 120 (or an element included within or in communication with the ONU 120), may be controlled by one or more elements on behalf of the OLT 110 and the ONU 120, or the like, as well as various combinations thereof.

In one example, the OLT 110 may be configured to control support for DS FEC for DS communications from the OLT 110 to an ONU 120. In one example, the OLT 110 may obtain channel characteristic information for a channel from the OLT 110 to the ONU 120 (e.g., from the ONU 120 where the ONU 120 determines the channel characteristic information and provides the channel characteristic information to the OLT 110), select a FEC setting for the channel from the OLT 110 to the ONU 120 where the FEC setting is selected based on the channel characteristic information, and provide an indication of the FEC setting from the OLT 110 to the ONU 120 for use in supporting DS FEC for DS communications from the OLT 110 to the ONU 120.

In one example, an ONU 120 may be configured to control support for DS FEC for DS communications from the OLT 110 to the ONU 120. In one example, the ONU 120 may obtain channel characteristic information for a channel from the OLT 110 to the ONU 120 (e.g., locally at the ONU 120 where the ONU 120 determines the channel characteristic information based on DS communications from the OLT 110), select a FEC setting for the channel from the OLT 110 to the ONU 120 where the FEC setting is selected based on the channel characteristic information, and provide an indication of the FEC setting from the ONU 120 to the OLT 110 for use in supporting DS FEC for DS communications from the OLT 110 to the ONU 120.

In one example, a controller may be configured to control support for DS FEC for DS communications from the OLT 110 to the ONU 120. In one example, the controller may obtain channel characteristic information for a channel from the OLT 110 to the ONU 120 (e.g., from the ONU 120 where the ONU 120 determines the channel characteristic information and provides it to the controller, from the OLT 110 where the ONU 120 determines the channel characteristic information and provides it to the OLT 110 which in turn provides it to the controller, or the like), select a FEC setting for the channel from the OLT 110 to the ONU 120 where the FEC setting is selected based on the channel characteristic information, and provide an indication of the FEC setting from the controller to the OLT 110 and to the ONU 120 for use by the OLT 110 and the ONU 120 in supporting DS FEC for DS communications from the OLT 110 to the ONU 120.

It will be appreciated that the PON 100 may be configured in various other ways to support DS FEC for DS communications from the OLT 110 to the ONUs 120.

The PON 100 may be configured to support US FEC for US communications from the ONUs 120 to the OLT 110. It will be appreciated that, as discussed further below, support for US FEC for US communications from an ONU 120 to the OLT 110 may by controlled by the OLT 110 (or an element included within or in communication with the OLT 110), may be controlled by the ONU 120 (or an element included within or in communication with the ONU 120), may be controlled by one or more elements on behalf of the OLT 110 and the ONU 120, or the like, as well as various combinations thereof.

In one example, the OLT 110 may be configured to control support for US FEC for US communications from the ONUs 120 to the OLT 110. In one example, the OLT 110 may obtain channel characteristic information for a channel from the ONU 120 to the OLT 110 (e.g., locally at the OLT 110 where the OLT 110 determines the channel characteristic information based on US communications from the ONU 120), select a FEC setting for the channel from the ONU 120 to the OLT 110 where the FEC setting is selected based on the channel characteristic information, and provide an indication of the FEC setting from the OLT 110 to the ONU 120 for use in supporting US FEC for US communications from the ONUs 120 to the OLT 110.

In one example, an ONU 120 may be configured to control support for US FEC for US communications from the ONUs 120 to the OLT 110. In one example, the ONU 120 may obtain channel characteristic information for a channel from the ONU 120 to the OLT 110 (e.g., from the OLT 110 where the OLT 110 determines the channel characteristic information and provides the channel characteristic information to the ONU 120), select a FEC setting for the channel from the ONU 120 to the OLT 110 where the FEC setting is selected based on the channel characteristic information, and provide an indication of the FEC setting from the ONU 120 to the OLT 110 for use in supporting US FEC for US communications from the ONUs 120 to the OLT 110.

In one example, a controller may be configured to control support for US FEC for US communications from the ONUs 120 to the OLT 110. In one example, the controller may obtain channel characteristic information for a channel from the ONU 120 to the OLT 110 (e.g., from the OLT 110 where the OLT 110 determines the channel characteristic information and provides it to the controller, from the ONU 120 where the OLT 110 determines the channel characteristic information and provides it to the ONU 120 which in turn provides it to the controller, or the like), select a FEC setting for the channel from the ONU 120 to the OLT 110 where the FEC setting is selected based on the channel characteristic information, and provide an indication of the FEC setting from the controller to the OLT 110 and to the ONU 120 for use by the OLT 110 and the ONU 120 in supporting US FEC for US communications from the ONUs 120 to the OLT 110.

It will be appreciated that the PON 100 may be configured in various other ways to support US FEC for US communications from the ONUs 120 to the OLT 110.

The PON 100, by supporting selection of FEC settings for communication channels between the OLT 110 and the ONUs 120, may be configured to support use of different FEC settings by different ONUs 120 connected to the same OLT 110, such as ONU-specific FEC settings on an ONU-by-ONU basis for the ONUs 120 connected to the same OLT 110, group-specific FEC settings for groups of ONUs 120 connected to the same OLT 110 (e.g., two groups of ONUs 120, four groups of ONUs 120, or the like), or the like, as well as various combinations thereof. For example, in the case in which an ONU-specific setting is used for an ONU 120, the channel characteristic information of the communication channel between the OLT 110 and the ONU 120 may be used to determine the ONU-specific setting to be used for the ONU 120 (e.g., as discussed hereinabove for a single ONU 120 that is connected to the OLT 110). For example, in the case in which a group-specific FEC setting is used for a group of ONUs 120 connected to the OLT 110, the channel characteristic information of the communication channels between the OLT 110 and the ONUs 120 may be used to identify the assignment of the ONUs 120 to the different groups of ONUs 120 and may then be used within the groups of ONUs 120 to determine the FEC settings for the different groups of ONUs 120 (which are to be applied to the ONUs 120 of the groups of ONUs 120), respectively. For example, in a P2MP network, channel characteristic information may be used for dividing the receivers into groups and for applying FEC settings to the receivers in the receiver groups, respectively.

The PON 100 is configured to support FEC for communications between the OLT 110 and the ONUs 120 by supporting intra-burst FEC switching for communications between the OLT 110 and the ONUs 120. The PON 100 may support intra-burst FEC switching for communications between the OLT 110 and the ONUs 120 by supporting use of different FEC codes for transmitting different portions of a data burst between the OLT 110 and the ONUs 120. The PON 100 may support intra-burst FEC switching for communications between the OLT 110 and the ONUs 120, by supporting use of different FEC codes for transmitting different portions of a data burst between the OLT 110 and the ONUs 120, based on use of messaging between the OLT 110 and the ONUs 120 for controlling switching between FEC codes within data bursts between the OLT 110 and the ONUs 120. For example, an ONU 120 may begin a transmission of a data burst to the OLT 110 using a first FEC code (using a first FEC code for a first portion of the data burst) and may then switch to use of a second FEC code within the data burst (using a second FEC code for a second portion of the data burst). For example, an ONU 120 may begin a transmission of a data burst to the OLT 110 using a first FEC code for a first codeword of the data burst or a first few codewords of the data burst and may then switch to using a second FEC code for the remainder of the data burst. For example, an ONU 120 may begin a transmission of a data burst to the OLT 110 using a first FEC code for most of the data burst and may then switch to using a second FEC code for the last few codewords of the data burst. For example, an ONU 120 may begin a transmission of a data burst to the OLT 110 using a first FEC code (using a first FEC code for a first portion of the data burst), may then switch to use of a second FEC code within the data burst (using a second FEC code for a second portion of the data burst), and may then switch to use of a third FEC code within the data burst (using a third FEC code for a third portion of the data burst). It will be appreciated that, although primarily presented with respect to use of specific numbers of FEC codes applied on specific numbers of portions of a data burst (e.g., two FEC codes within a data burst applied to two portions of the data burst, three FEC codes within a data burst applied to three portions of the data burst, or the like), any suitable number of FEC codes may be used within a data burst, on any suitable number of portions of the data burst, for supporting transmission of respective portions of the data burst, respectively. The OLT 110 may control the switch between the FEC codes for the data burst of an ONU 120 based on monitoring of a communication channel from the ONU 120 to the OLT 110, assessment of the communication channel from the ONU 120 to the OLT 110, or the like, as well as various combinations thereof. The OLT 110 may control the switch between the FEC codes for the data burst of an ONU 120 based on detection of one or more conditions associated with the communication channel from the ONU 120 to the OLT 110. The OLT 110 may control the switch between the FEC codes for the data burst of an ONU 120 by sending one or more instructions to the ONU 120 (e.g., sending an instruction with the respective FEC code for each portion of the data burst, sending a switch instruction when a switch between FEC codes between adjacent portions of the data burst is to be performed, sending separate instructions with the respective FEC codes for the respective portions of the data burst, or the like, as well as various combinations thereof). The ONU 120 may perform the switch between the FEC codes within a data burst of the ONU 120 based on one or more instructions received from the OLT 110 (e.g., receiving an instruction with the respective FEC code for each portion of the data burst, receiving a switch instruction when a switch between FEC codes between adjacent portions of the data burst is to be performed, receiving separate instructions with the respective FEC codes for the respective portions of the data burst, or the like, as well as various combinations thereof). The instruction(s) for performing intra-burst FEC switching may be generic messages, burst profile messages (which may be configured to specify, for each FEC code to be used within a burst, a respective location within the data burst at which or over which the FEC code is to be applied), or the like, as well as various combinations thereof. It will be appreciated that, although primarily described with respect to performing intra-burst FEC switching for data bursts from an ONU 120 to the OLT 110, intra-burst FEC switching also or alternatively may be performed for data bursts from the OLT 110 to an ONU 120.

It will be appreciated that the various functions discussed as being performed by specific elements of PON 100 may be performed by various other elements of PON 100. For example, various functions described as being performed by the OLT 110 may be performed by one or more of the components of the OLT 110 (e.g., a decoder, a decoder controller, an encoder, an encoder controller, an OLT controller, or the like, as well as various combinations thereof), one or more elements in communication with the OLT 110, or the like, as well as various combinations thereof. Similarly, for example, various functions described as being performed by the ONU 120 may be performed by one or more of the components of the ONU 120 (e.g., a decoder, a decoder controller, an encoder, an encoder controller, an ONU controller, or the like, as well as various combinations thereof), one or more elements in communication with the ONU 120, or the like, as well as various combinations thereof. It will be appreciated that such functions may be combined in various ways, distributed in various ways, or the like, as well as various combinations thereof.

It will be appreciated that, although various example embodiments presented herein are primarily described relative to the OLT and ONU perspectives, various example embodiments presented herein also may be described relative to transmitter and receiver perspectives (e.g., various example embodiments presented herein for supporting DS FEC from the OLT to the ONU may be considered to be embodiments for supporting FEC from a transmitter to a receiver where control of the FEC may be provided on the transmitter side or the receiver side, various example embodiments presented herein for supporting US FEC from the ONU to the OLT may be considered to be embodiments for supporting FEC from a transmitter to a receiver where control of the FEC may be provided on the transmitter side or the receiver side, and so forth), encoder and decoder perspectives (e.g., various example embodiments presented herein for supporting DS FEC from the OLT to the ONU may be considered to be embodiments for supporting FEC from an encoder to a decoder where control of the FEC may be provided on the encoder side or the decoder side, various example embodiments presented herein for supporting US FEC from the ONU to the OLT may be considered to be embodiments for supporting FEC from an encoder to a decoder where control of the FEC may be provided on the encoder side or the decoder side, and so forth), or the like, as well as various combinations thereof. In other words, the ONU may the transmitter or the receiver and the OLT may be the transmitted or the receiver, the ONU may be the encoder or decode and the OLT may be the encoder or the decoder, or the like. It will be appreciated that various example embodiments presented herein may be further understood by way of reference to example embodiments for supporting selection of FEC settings for a communication channel from a transmitter to a receiver and communication of the FEC setting for the communication channel to the transmitter and the receiver for use by the transmitter and the receiver in applying FEC for communications on the communication channel.

It will be appreciated that such example embodiments may be further understood by considering various aspects of such example embodiments as discussed further herein.

Figure 2:
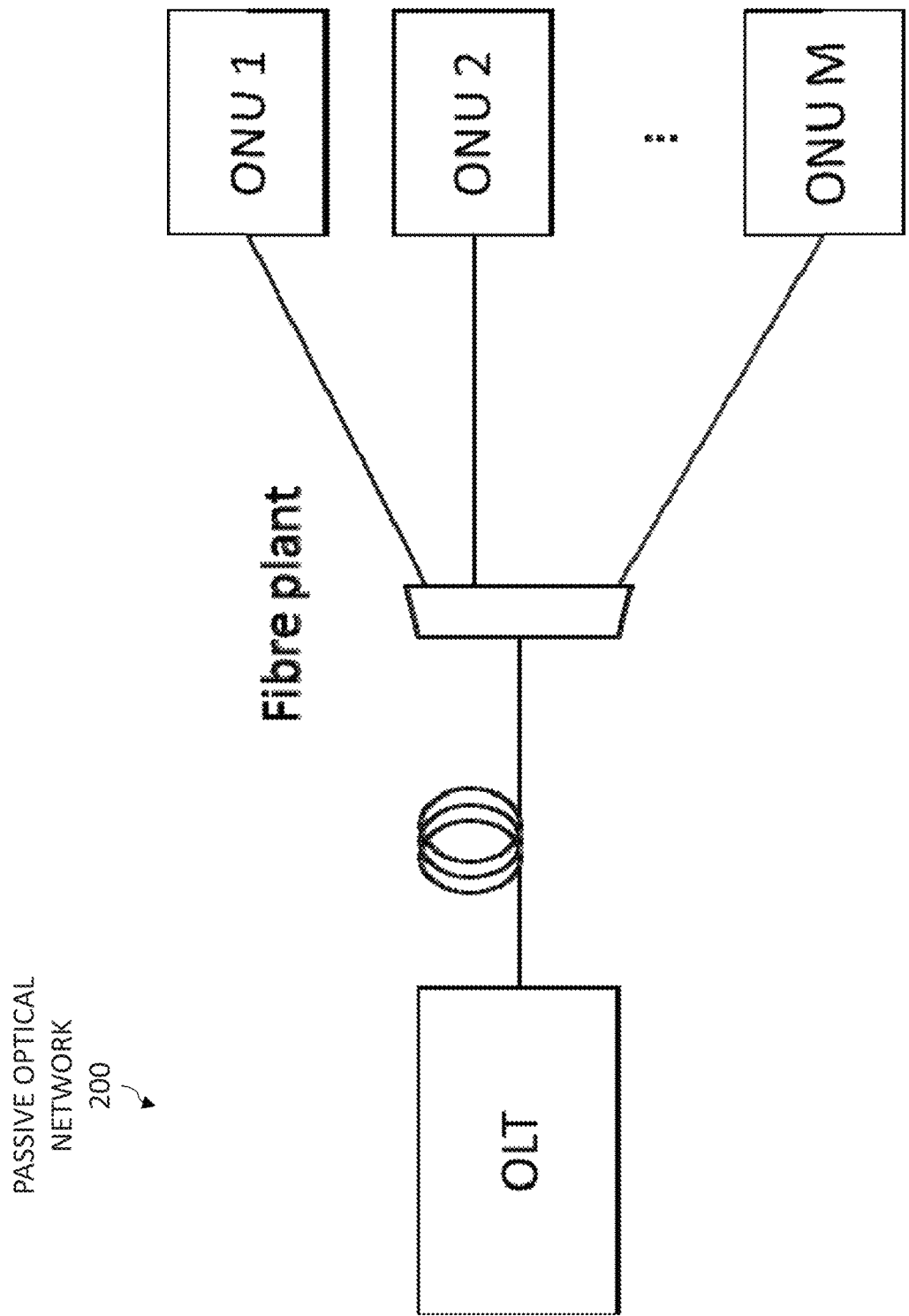
FIG. 2 depicts an example embodiment of a PON configured to support FEC for communication channels.

Various example embodiments relate to next-generation passive optical networks (PONs) used, e.g., to deliver broadband access. PON systems have a point-to-multi-point (P2MP) topology, in which one optical line terminal (OLT) at the network side is used to connect to a multitude (e.g., up to 64) of optical network units (ONUs) at the user side (see passive optical network 200 of FIG. 2) by means of an optical distribution network (ODN) or fiber plant that contains optical fibers and splitters. Most PON technologies, such as G-PON, E-PON, and XGS-PON, are time-division multiplexing (TDM) PON technologies, in which the fiber medium is shared in time between the different ONUs. Also, time- and wavelength-division multiplexing (TWDM) PON technologies exist, such as NG-PON2, in which multiple TDM systems at different wavelength are stacked on the same PON system. Further, other experimental PON technologies such as those employing orthogonal-frequency division multiplexing (OFDM) also exist. Various example embodiments presented herein may be applied to both TDM PON systems, TWDM PON systems, or other suitable types of PON systems.

For upstream (US) transmission, such PON systems typically rely on burst mode operation, in which each ONU is allocated a time window within which it can transmit a burst of data. Only a single ONU can transmit at a given time. A burst typically consists of a preamble, a delimiter, and data.

The preamble corresponds to a known bit pattern. During the reception of the preamble, the receiver can adjust itself to the incoming burst. For instance, during the preamble, the receiver will adjust the analogue front-end, (i.e., adjust the analogue gain to signal strength of the burst, as well as set a correct DC offset to compensate for the offset in the incoming burst), lock on the clock of the incoming burst (by applying clock and data recovery (CDR)), and possibly train the equalizer used to compensate possible inter-symbol interference introduced by the dispersion of the fiber or due to limited bandwidth of transmitter or receiver components.

A delimiter is a short, known bit pattern that is used to indicate the end of the preamble and the beginning of the data.

The data is the part of the burst that includes the actual data bits, as well as possibly control signals to be transmitted. The data is typically protected by forward error correction (FEC) and is organized in FEC codewords.

Recently, ITU Q2 has started working in the G.hsp project on a next-generation TDM-PON standard for 50G downstream, and 10G/12.5G/25G/50G upstream.

For the next-generation 25G/50G technologies, PON technologies will use low density parity check (LDPC) codes for forward error correction (FEC). LDPC codes are an advanced and popular type of FEC that is used to correct bit errors that occur during the transmission of the data over a physical medium. LDPC codes are used in many contemporary standards, such as for DSL (G.mgfast), WiFi, (Wimax), wireless (5G NR), coaxial cable (DOCSIS 3.1 and DOCSIS 3.1 FDX), powerline communication (G.hn), and so forth.

An LDPC code is a block code that takes K information bits and encodes these K bits into a codeword of N bits, which generally includes the K information bits in addition to N−K parity bits (meaning it is a systematic code). The code rate of a LDPC code is R=K/N, and its characteristics are fully described by a (N−K)×N parity check matrix H. FIG. 3 shows an example of a parity check matrix 300. The N=9 columns of H correspond to the bits of the LDPC codeword, with the first K=5 bits corresponding to information (data) bits $d_i$ and the last (N−K)=4 bits corresponding to the parity bits $p_i$. The N−K=4 rows correspond to the check constraints that any valid codeword of the LDPC code should satisfy, namely that the XOR-sum of all the bits indicated in the row has to be 0. This can be formally expressed as (a sum followed by a modulo-2 operation is equivalent to an XOR-sum): mod(H. c, 2)=0, where c is the column vector of the data bits d and the parity bits p.

Contemporary LDPC codes are typically quasi-cyclic (QC) LDPC codes. The parity check matrix of such code can be subdivided into Z×Z sub-matrices in which each sub-matrix is either a rotated identity matrix or an all zero matrix. Here Z is often called the lifting factor. The parity-check matrix of a QC code can be represented using a compact matrix $H_{compact}$ as for instance shown in the example parity check matrix 400 of FIG. 4. Here −1 indicates an all zero submatrix and any other element m indicate an identity submatrix that has been circularly right shifted by m. The advantage of QC LDPC codes is that they inherently allow parallelization, which can for instance be seen by the fact that each of the Z check constraints in a row of $H_{compact}$ are the same constraint but applied to a different set of (independent) bits. Within the G.hsp standard, LDPC codes are used to lower the bit error rate from in worst-case 1e−2 before the LDPC decoding (input BER) to 1e-12 after the LDPC decoding (output BER).

As explained above, an LDPC code is characterized by a code rate R=K/N, that is defined by its parity check matrix (i.e., by its structure). There are, however, two simple techniques that can be used to derive additional LDPC daughter codes from a so-called LPDC mother code: shortening and puncturing.

In shortening, the LDPC code can be modified by setting information bits to a fixed value (0), and not transmitting the bits. Shortening $N_s$ bits lowers the information rate to $R=(K-N_s)/(N-N_s)$, and allows achievement of the same output BER at an increased BER value.

In puncturing, the LDPC can be modified by not transmitting certain bits (either information or parity bits). These bits are then treated as erasures at the receiver (i.e., bits with unknown value), and have to be retrieved by the LDPC decoder. Puncturing $N_p$ increases the information rate to $R=K/(N-N_p)$, but requires a lower input BER to achieve the same output BER.

By jointly puncturing and shortening, the rate $R=(K-N_s)/(N-N_p-N_s)$ of an LDPC code can be adjusted over a wide range. If for instance, keeping the code length fixed to N', the code length can be varied from $R_{min}=(K-(N-N'))/N'$ to $R_{max}=K/N'$ It is noted that that these techniques are not specific to LDPC codes, but can be generally applied to FEC codes.

For a specific upstream wavelength in a T(W)DM PON system, burst mode transmission in the upstream direction involves one ONU transmitting at any given time. In previous PON systems, such as XGS PON and IEEE 802.3ca, the choice of FEC code for upstream transmission is determined by the corresponding standard. All ONUs are expected to transmit based on the selected FEC code. Further, all codewords in an upstream burst from an ONU employ the same FEC code except possibly the last codeword of the burst where additional shortening may be employed to provide a finer granularity of the burst duration.

In general, the FEC for upstream transmission is static and does not take into account the variations in the FEC decoder input bit-error rate (BER) for different ONUs. It also does not take into account FEC decoder input BER variations within a burst from a given ONU.

The first or first few codewords of an upstream burst may experience a higher BER as compared to the rest of the burst on account of transients associated with laser activation and receiver settling, or due to insufficient convergence of the receiver equalizer. When receiver equalization is used, one has to balance the length of the preamble with the level of convergence of the equalizer. On the one hand, a longer preamble will result in a better converged equalizer at the expense of lower efficiency due to a larger preamble overhead; on the other hand, a shorter preamble improves the efficiency at the expense of higher BER at the start of the burst due to an insufficiently converged equalizer.

Further, bit-interleaving over multiple codewords may be used to mitigate the impact of correlated errors with binary LDPC FEC, especially for 50G upstream with receiver equalization. While bit-interleaving does not change the average BER at the LDPC decoder input, it breaks the correlation among errors in a codeword, thereby reducing the correlated error penalty for binary FEC codes. However, employing bit-interleaving at the end of a burst can be highly inefficient as it requires transmitting blocks of multiple codewords (as many as the interleaving length); if bit-interleaving is not used at the end of the burst, the corresponding codewords may suffer from poorer performance due to the adverse impact of correlated errors.

Figure 5:
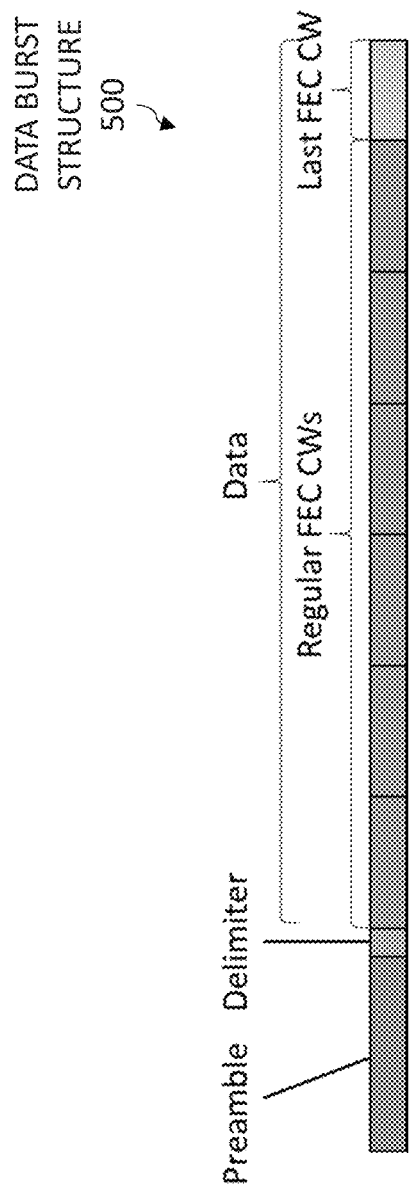
FIG. 5 depicts an example of a data burst structure which may be used in a PON system.

FIG. 5 depicts an example of a data burst structure which may be used in a PON system. In the data burst structure 500 of FIG. 5, the same FEC code is used throughout the burst, except for the last codeword. Typically, the last codeword would be shortened to fit to the assigned burst length. Similarly, the last codeword can be both punctured and shortened according to a pre-defined rule based on the upstream grant size. The additional puncturing is applied to reduce the amount of parity sent in the last codeword. The amount of puncturing and shortening is based on pre-defined rules expected to be applied by all ONUs at all times. There is no indication provided by the OLT to the ONU other than the grant size.

Various example embodiments may be configured to use different FEC codes in different portions of a burst to enhance the throughput and performance of upstream transmission.

Various example embodiments may be configured to change the puncturing and/or shortening based on position of the codeword in the burst.

Various example embodiments may be configured to provide tolerance to settling transients and insufficient equalizer convergence. The first or first few codewords of an upstream burst may experience a higher bit error rate as compared to the rest of the burst on account of transients associated with laser activation and receiver settling, or due to insufficient convergence of the receiver equalizer. In such cases, the OLT may configure the first or first few codewords of an upstream burst to operate with a lower rate code that provides additional margin against these transients. For the remainder of the burst, operation can switch to a higher rate.

Various example embodiments may be configured to provide a performance guarantee in the absence of bit-interleaving: Bit-interleaving may be used to mitigate the impact of correlated errors, especially for 50G upstream. In case bit-interleaving is not adopted for upstream or (partially) not used in a burst (for instance to reduce latency or for short burst lengths), a lower rate code could instead be used at the end of the burst to provide increased margin against the correlated errors.

Various example embodiments may be configured to provide better efficiency at the end of a burst. Considerations for improving burst efficiency have typically focused only on modifying the last codeword of the burst; however, such bursts are not balanced. With such schemes, one can have a full-length codeword followed by a tiny one. However, in such a situation, a better-balanced burst with two shorter codewords of roughly equal length is preferable. The OLT can direct the ONU to apply the appropriate FEC codes for the end of the burst that includes more than just the last codeword of the burst.

Various example embodiments may be configured to realize a flexible US FEC scheme in which the OLT can control the used FEC code rate on a per ONU basis and, for a given ONU, on an intra-burst basis using two or more FEC settings for two or more portions of a given data burst of the ONU. For example, upstream operation can begin with transmission from an ONU using a low rate code with higher error correction capability to accommodate the worst case. Based on an assessment of the upstream channel, the OLT can optionally switch the ONU to higher rates. In addition, the burst profile message could be used to communicate the choice of codes on a per burst basis, or even to signal mid-burst code switching to provide protection against for instance settling transients and insufficient equalizer convergence, bit interleaving turning on/off, or for improved efficiency of the last codewords. Various example embodiments may be configured to enhance or complement a burst profile message from the OLT to signal to each ONU the choice of the FEC code or codes to be used within each burst. This also may include an indication of the exact location in a burst where the FEC codes must be changed if needed.

Figure 6:
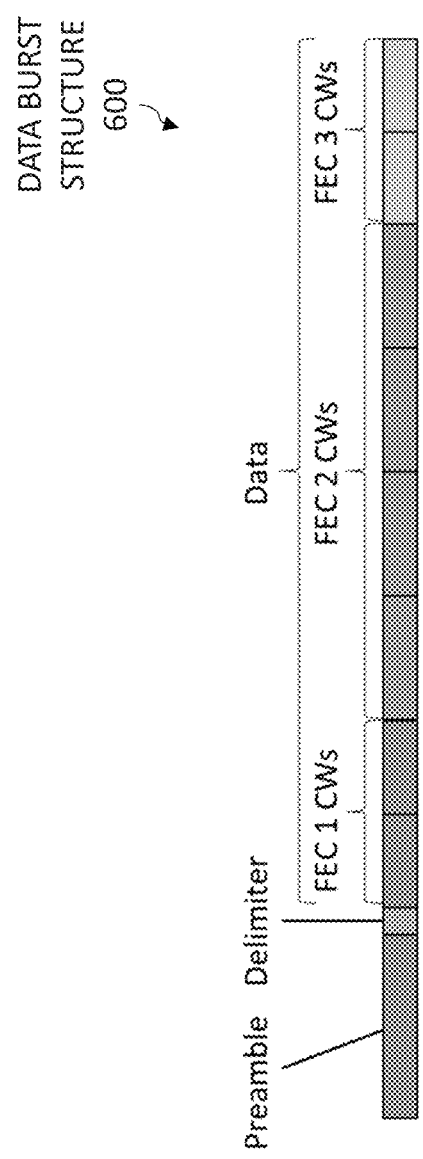
FIG. 6 depicts an example of a data burst structure which may be used in a PON system.

FIG. 6 depicts an example of a data burst structure which may be used in a PON system. In the data burst structure 600 of FIG. 6, the preamble and delimiter are followed by the data. The data consists of different sections, and in each section, a different FEC code is applied. For example, in the illustration, codewords of FEC 1 are used at the head of the data burst (first section), codewords of FEC 2 are used during the body of the data burst (second section), and codewords of FEC 3 are used at the tail of the data burst (third section). In general, the burst may consist of fewer than three sections (e.g., two sections or even a single section) or more than three sections in which different FEC codes may be applied.

In order for the ONU to encode a burst in the above fashion, a number of example embodiments may be applied. In at least some example embodiments, the OLT may communicate the desired burst structure indicating the selected code or code setting and the number of codewords of each section (or at least one section). In at least some example embodiments, the number of codewords is indicated, while the code setting that is used is predetermined. In at least some example embodiments, the FEC settings are indicated for one section, while the other sections have pre-determined FEC settings. In at least some example embodiments, the location(s) of a FEC setting(s) is indicated. It will be appreciated that less or more, as well as different types of information, may be indicated.

In at least some example embodiments, the OLT communicates to the ONU the specifics of the structure of the burst using the Burst_Profile Physical Layer Operation and Management (PLOAM) message. Each burst description is allocated a unique index. Additional octets may be added to the Burst_Profile message 700 depicted in FIG. 7 to capture the FEC setting in a burst section. As an example, assume that there are up to 16 possible FEC settings to choose from, and that the FEC setting can be selected using a 4-bit index (it will be appreciated that fewer or more codewords may be supported and, that, smaller or larger bit indexes may be used). The example focuses on a burst structure of 3 sections (although it will be appreciated that fewer or more data burst sections may be supported). In this example, the burst profile may include at least one of the following fields: (1) a 4-bit field indicating the FEC setting of the main body (the second section, FEC 2, in FIG. 6), where this FEC setting is used except possibly at the head of the burst (the first section) or the tail of the burst (the third section). (2) a 4-bit field for the FEC setting of the head of the burst (the first section, FEC 1, in FIG. 6), (3) a 4-bit field indicating the number of FEC codewords (0-15) of FEC 1 to be transmitted, (4) a 4-bit field for the FEC setting for the tail of the burst (the third section, FEC 3, in FIG. 6), and (5) a 4-bit field indicating the number of FEC codewords (0-15) of FEC 3 to be transmitted, where this number of FEC codewords may be counted from the rear end of the burst.

In at least some example embodiments, the OLT may indicate the index of the selected burst profile in the BWmap partition of the framing sublayer (FS) header portion of the downstream FS frame. In general, for a given ONU, the selection of the burst profile will be dependent on other parameters in the BWmap for that ONU including the GrantSize field. This downstream FS frame format 800 is depicted in FIG. 8. By using the enhanced burst profile PLOAM message described above to configure multiple distinct burst profiles (i.e., with distinct indices) in an ONU, the OLT can then use the burst profile in the BWmap for the ONU to suitably select the desired combination of FEC settings and corresponding durations at any future time. In addition, this approach also allows the OLT to precisely control the desired combination of FEC settings and corresponding durations for each burst from the ONU.

It is noted that the number of codeword used in each section will generally depend on the burst size (grant size). For very short bursts (shorter than the number of codewords assigned to the first section), it might contain only a single section (only the head of the burst with a reduced number of codewords, or the section with the highest/lowest code rate). Alternatively, these short bursts might contain two sections (head and tail, both possibly with a reduced number of codewords). Generally, the number of codewords in each section may be adjusted based on the grant size according to pre-defined rules. Alternatively, different profiles may be established in order to handle shorter bursts, and these may involve switching between only two type of FEC settings, or using only one FEC setting in the burst.

It will be appreciated that various example embodiments discussed hereinabove also may be used in conjunction with rules for burst termination.

It will be appreciated that various other techniques may also be employed. For example, instead of choosing from an indexed set of codes or FEC settings, the OLT can specify the amount of shortening and puncturing needed to construct each code from the mother code in the Burst_Profile PLOAM message. Further, the size of the Burst Profile field in the BWmap partition may be increased beyond the currently provisioned 2 bits (see FIG. 7). Instead of using the Burst Profile message, the FEC settings could also be signaled using a different PLOAM message (control message).

It will be appreciated that the signaling using the BW map may involve indicating a channel quality class to each ONU for each burst. Using the channel quality class and the actual burst length, it may then be possible to automatically compute at both OLT and ONU how the data is grouped into codewords and which LDPC codes are used.

In at least some example embodiments, the different FEC codes are LDPC codes, that are obtained by puncturing and shortening from a single mother code. The FEC settings that are communicated could be the amount of puncturing and or shortening, or an index value indicating a pre-determined amount of puncturing and shortening.

In at least some example embodiments, the FEC codes used in the burst profiles and how the ONUs are assigned to the burst profiles can be modified by a FEC controller. For instance, the FEC controller can modify the error performance of bursts of an ONU and modify the FEC settings accordingly. This can be one shot, based on error statistics (bit errors or codeword errors), or can be more gradual (one step at a time) or even trial and error (move back quickly if significantly erroneous). This FEC controller can be internal to the OLT, or external to the OLT (and more slow). The FEC settings can be selected based on observed error statistics but also based on quality of service (QoS) requirements defined for that ONU, or traffic container. In at least some example embodiments, some FEC settings (or burst profiles) might be assigned per ONU, while other FEC settings (burst profiles) might be broadcast settings, i.e., all ONUs can use them. For instance, there may be a default FEC profile communicated in broadcast. One use case is a recovery profile (lowest code rate throughout) that the OLT can apply to an ONU if last few burst were significantly erroneous. Another use case is an initial profile, to be used during or right after activation. This can also be using the lowest code rate throughout. In at least some example embodiments, the FEC setting may be configured to indicate to the ONU to make a computation (e.g., for the segmentation process and the selection of codeword length for each of the segments).

In at least some example embodiments, dynamic intra-burst FEC switching may include the determination of the length of the segments and their FEC settings relative to the overall length of the burst. This may be a rule-based approach. There is also a possibility to apply codes with unequal error protection, in particular, where the beginning of the codeword is better protected than the "tail" of the same codeword. By segmenting the burst, it is also possible to determine the channel quality, by monitoring the number of transmission errors per segment. This then also relates to the size of each group of segments relative to the overall size of the burst. For instance, if the first portion of the data burst is more error-prone, one option may be to use a higher performing FEC code and/or a longer one to mitigate the impact of the errors. There also may be support for multiple families of FEC codes, e.g., algebraic codes for short segments and iterative codes for other segments (e.g., for transceivers that can support both Reed Solomon and LDPC codes). If a burst is too short to have three segments, then the default could be to code it according to the first segment and third segment and track associated error measurements. If the burst is even shorter, then the default could be to code it according to the first segment. It will be appreciated that at least some such capabilities also may be provided by allowing one of the segment groups to have zero-length.

In at least some example embodiments, the FEC setting and the process of segmenting the burst into codewords of a particular length may be related. It is noted that these could be different for each group of segments. With the length and an error profile for the burst, it is possible to provide an algorithm that uses these inputs to determine the length of each segment in a segment group (first, second, third), and its FEC parameters. This may involve additional shortening and puncturing beyond the base codes (e.g., rate 33/45, 40/45, and so forth). In at least some example embodiments, a FEC setting may include a rule for the length of each segment (group) of the data burst.

In at least some example embodiments, control of intra-burst FEC setting may be based on one or more of a message that results in the setting or the change of a certain profile, adding control fields with a per-burst specification of the scheme that is to be used, transmitting the settings for each group of segments per burst, or the like, as well as various combinations thereof. In at least some example embodiments, a message used to control intra-burst FEC setting may include an indication of a location within the data burst at which the transmitter is to switch from using a first forward error correction setting to using a second error correction setting (e.g., where the location may be a bit position, a codeword boundary, or the like).

It will be appreciated that, although primarily presented with respect to embodiments in which the number of segments of a data burst matches the number of FEC settings specified in the FEC profile, in at least some example embodiments the number of segments of the data burst and the number of FEC settings specified in the FEC profile may be different. For example, a FEC profile may be defined for applying a first FEC setting to a first segment, a second FEC setting to a second segment and a third FEC setting to a third segment, and the FEC profile may still be applied to data bursts that include three segments as well as data segments that include only two segments or even a single segment (e.g., for a shorter data burst that includes only a single segment the first FEC setting of the FEC profile may be applied and the other two FEC settings will not be applied since the second and third segments are essentially empty). It will be appreciated that various other types of FEC profiles (including various other numbers of FEC settings specified for various segments of data bursts) may be used to support FEC for data bursts having various numbers of segments.

As indicated above, the LDPC (17280, 14592) code has been agreed for use in G.hsp downstream. This code is based on the IEEE 802.3ca mother code with 384 bits of puncturing and no shortening. Based on the same mother code matrix, several shortening and puncturing schemes have been considered to improve the efficiency of upstream transmission for short bursts. One such proposal focuses on improving the efficiency of transmission of the last codeword in a burst while maintaining performance equal or better than the (17280, 14592) code. Various example embodiments presented herein, based on evaluations of the performance of codes with different shortening and puncturing of the 802.3ca mother code, may be configured to provide a more general throughput vs. performance flexibility in the upstream direction.

It is noted that a primary motivation for choosing the length of 17280 for downstream transmission was to ensure an integer number of LDPC codewords in the continuous mode frame with a duration of 125 μs. Such a constraint does not apply in the upstream due to burst mode operation. A code length of 11520=45*256=2*17280/3 has been selected for analysis since it provides a good code rate flexibility on either side of the downstream LDPC (17280, 14592) code with rate 0.844. For length 11520, the lowest code rate is achieved when none of the parity columns are punctured; this gives the (11520, 8448) code with rate=33/45=0.733, and this code is referred to as C1 for convenience. To achieve the highest code rate, the puncturing is limited to a maximum of 7 columns; this gives the (11520, 10240) code with rate=40/45=0.889, and this code is referred to as C2 for convenience.

Figure 9:
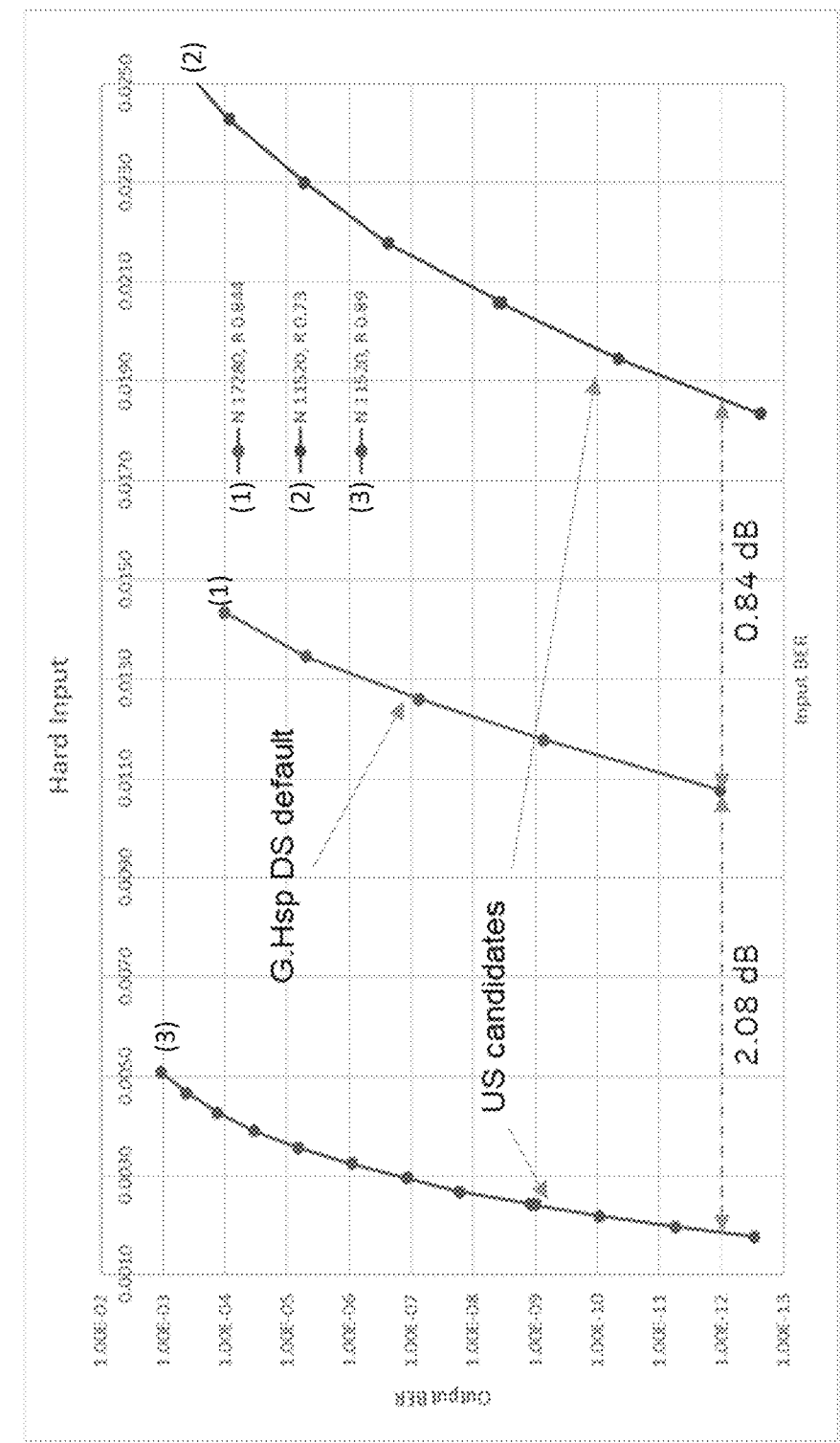
FIG. 9 depicts hard decision performance of an LDPC (11520,8448) code of length 11520 and 8448 information bits, with has a rate 0.733, and an LDPC(11520, 10240) code with rate 0.889.

FIG. 9 depicts hard decision performance of an LDPC (11520,8448) code of length 11520 and 8448 information bits, with has a rate 0.733, and an LDPC(11520, 10240) code with rate 0.889. The performance information 900 of FIG. 9 shows the hard-input BSC performance of the G.hsp downstream code and the codes C1 and C2. The code parameters as well as their BER performance and electrical coding gain (ECG) are provided in Table 1.

TABLE 1

| N' | K' | M' | N | K | M | Code Description | S | P | R | BERin | ECG (Gross) (dB) |
|---|---|---|---|---|---|---|---|---|---|---|---|
| 17280 | 14592 | 2688 | 67.5 | 57 | 10.5 | G.hsp OS default | 0 | 1.5 | 0.844444 | 1.08E−02 | 0.00 |
| 11520 | 8448 | 3072 | 45 | 33 | 12 | US C1 | 24 | 0 | 0.733333 | 1.85E−02 | 0.84 |
| 11520 | 10240 | 1280 | 45 | 40 | 5 | US C2 | 17 | 7 | 0.888889 | 1.76E−03 | −2.08 |

The C1 (rate 0.733) code achieves 1E-12 at 1.85E-2 and can tolerate 0.84 dB worse electrical SNR as compared to the default, and results in a 13% lower throughput compared to the default rate 0.844 code.

The C2 (rate 0.889) Code achieves 1E-12 at 1.76E-3 and requires 2.08 dB more electrical SNR as compared to the default, has better BER performance and higher rate (throughput) than RS (248, 216) of rate 0.871, and provides 5% higher throughput over the default rate 0.844 code.

Figure 10:
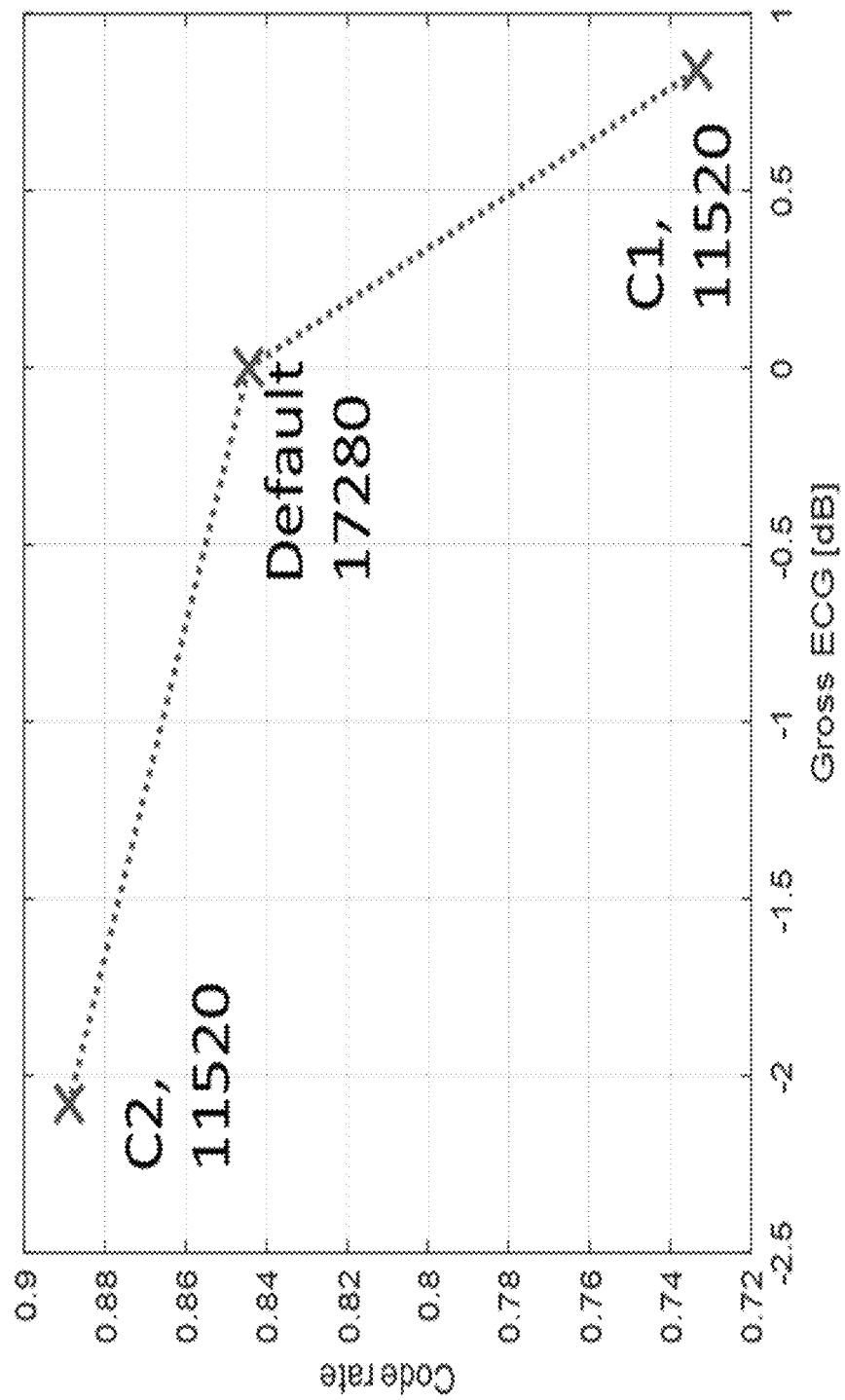
FIG. 10 depicts the code rate as a function of the gross electrical coding gain (ECG) with respect to the default.

These codes together accommodate close to 3 dB of electrical SNR variation; this can typically correspond to 2 to 3 dB of optical power. The code rate as a function of gross ECG with respect to the default is illustrated in FIG. 10.

Various example embodiments presented herein may be configured to provide a flexible FEC scheme for upstream data bursts. Various example embodiments may be configured to provide a flexible FEC scheme in which the FEC code can be adapted to trade-off throughput for performance in upstream.

Various example embodiments may be configured to provide tolerance to settling transients. The first or first few codewords of an upstream burst may experience a higher bit error rate as compared to the rest of the burst on account of transients associated with laser activation and receiver settling, or due to insufficient convergence of the receiver equalizer. In such cases, the OLT may configure the first or first few codewords of an upstream burst to operate at the lower rate of 0.73 to provide additional margin against these transients. For the remainder of the burst, operation can switch to a higher rate.

Various example embodiments may be configured to provide performance guarantee in the absence of bit-interleaving. Bit-interleaving may be necessary to mitigate the impact of correlated errors, especially for 50G upstream. In case bit-interleaving is not adopted for upstream or (partially) not used in a burst, the rate 0.73 code could instead provide increased margin against the correlated errors.

Various example embodiments may be configured to provide better efficiency for the last codeword in a burst. Excessive shortening of the last codeword of the burst leads to inefficient transmission. For a specific code rate, this inefficiency is higher for a longer code length since the parity portion scales with length. The rate 0.889 code, by virtue of having only 5 columns of parity, already provides good efficiency and obviates the need to transition to certain short or medium codewords. For operation at rate 0.733, certain schemes may be used with different short and medium code lengths that guarantee an output BER of 1E-12 at input BER of 1.85E-2 or higher.

Various example embodiments may be configured to provide increased tolerance to ONU transmitter optics. Low cost optics at the ONU transmitter can exhibit high variability in launch power. The rate 0.733 code provides additional margin to accommodate such variations for ONUs operating close to the budget limit.

Various example embodiments may be configured to provide improved US throughput for many ONUs. Many ONUs in a PON are likely to operate with significant margin with respect to the loss budget. In the example of the considered FEC codes, such ONUs could take advantage of the 5% higher throughput provided by the rate 0.889 code.

Various example embodiments may be configured to provide decreased aging margin. Often, a considerable aging margin has to be provisioned, to take into account surplus loss due to for instance fiber repairs. By using the rate 0.733 code for degraded ONUs, the aging margin could be reduced.

Various example embodiments may be configured to realize a flexible US FEC scheme in which the OLT may control the used FEC code rate on a per ONU basis. Upstream operation can begin with transmission from an ONU using the rate 0.73 code to accommodate the worst case. Based on an assessment of the upstream channel, the OLT can optionally switch the ONU to higher rates. In addition, the burst profile message could be used to communicate the choice of code on a per burst basis, or even to signal mid-burst code switching to provide protection against for instance settling transients, bit interleaving turning on/off, or for improved efficiency of the last codeword.

Various example embodiments may be configured to realize a flexible FEC scheme based on evaluation of the performance of codes of length 11520 based on the 802.3ca mother code. The performance for rates of 0.733 and 0.889 span a 3 dB electrical SNR range and provide flexibility between throughput and performance. The flexibility offered by these codes can be harnessed in several ways to improve the robustness or throughput of upstream transmission.

It will be appreciated that, although primarily presented herein with respect to example embodiments in which support for FEC is provided within the context of communication of data over a particular types of physical medium (namely, a PON), various example embodiments presented herein may be used, or adapted for use, within the context of communication of data over various other types of physical media. For example, various example embodiments presented herein may be used, or adapted for use, within the context of communication of data over various other types of wired media, such as other types of fiber networks (e.g., point-to-point fiber, or the like), Ethernet, DSL, cable (e.g., DOCSIS 3.1, DOCSIS 3.1 FDX, or the like), powerline communication (e.g., G.hn or the like), or the like, as well as various combinations thereof. For example, various example embodiments presented herein may be used, or adapted for use, within the context of communication of data over various other types of wireless media, such as cellular (e.g., 4G, 4G LTE, 5G or the like), WiFi, WiMAX, satellite, or the like, as well as various combinations thereof. It will be appreciated that various example embodiments presented herein may be used, or adapted for use, within the context of communication of data over various other types of physical media, interfaces, networks, or the like, as well as various combinations thereof.

Various example embodiments for supporting FEC on a communication channel, by controlling FEC settings of FEC for the communication channel, may provide various advantages or potential advantages. For example, various example embodiments for supporting FEC on a communication channel may be configured to improve throughput of upstream transmission from each ONU that is capable of supporting mid-burst CW switching. For example, various example embodiments for supporting FEC on a communication channel may be configured such that, even when a PON has a mix of ONUs that support mid-burst FEC switching and that do not support mid-burst switching (which may be referred to as 'legacy' ONUs), the improved throughput experienced by the ONUs supporting mid-burst switching can improve overall throughput by allowing the legacy ONUs more transmission time. Various example embodiments for supporting FEC on a communication channel may provide various other advantages or potential advantages.

Figure 11:
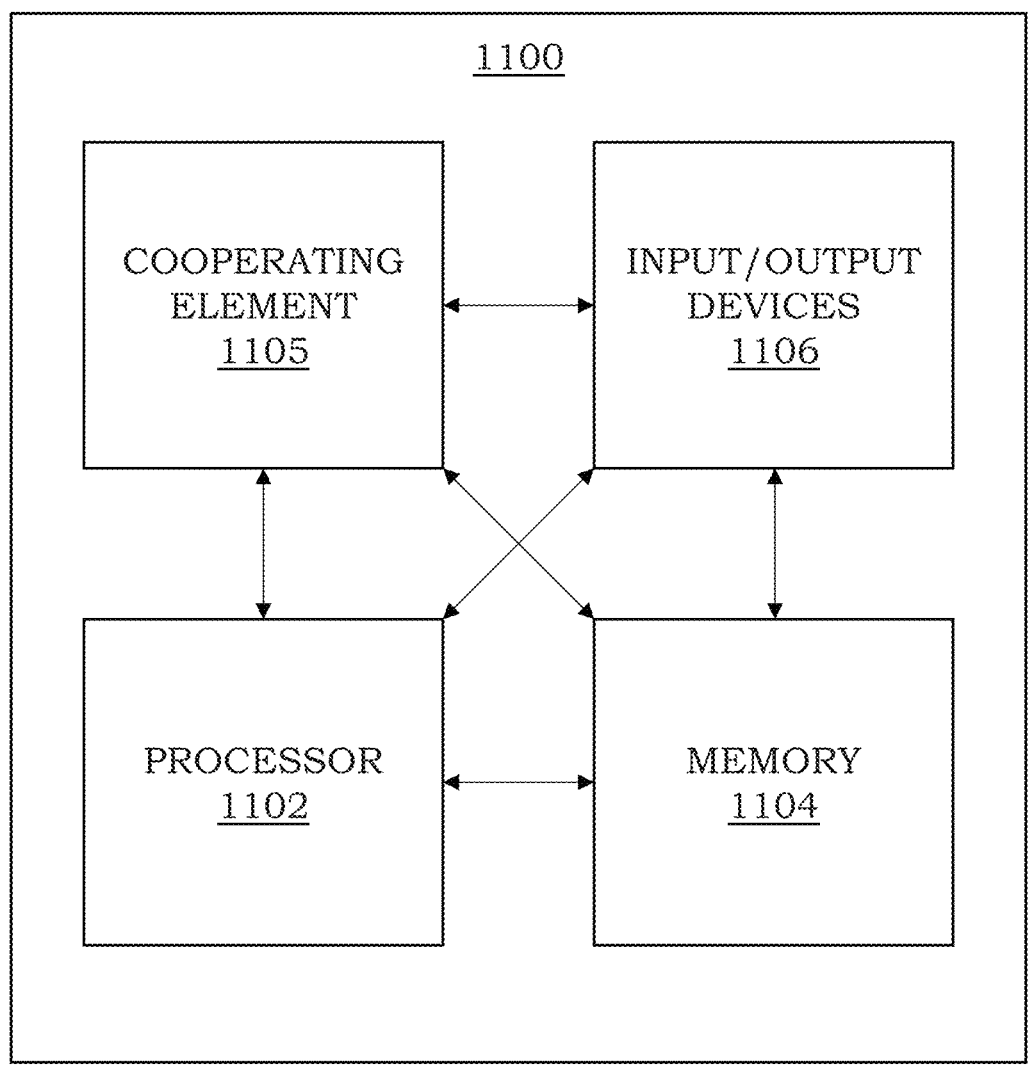
FIG. 11 depicts an example embodiment of a computer suitable for use in performing various functions presented herein.

FIG. 11 depicts an example embodiment of a computer suitable for use in performing various functions presented herein.

The computer 1100 includes a processor 1102 (e.g., a central processing unit (CPU), a processor, a processor having a set of processor cores, a processor core of a processor, or the like) and a memory 1104 (e.g., a random access memory, a read only memory, or the like). The processor 1102 and the memory 1104 may be communicatively connected. In at least some example embodiments, the computer 1100 may include at least one processor and at least one memory including computer program code, wherein the at least one memory and the computer program code are configured to, with the at least one processor, cause the computer to perform various functions presented herein.

The computer 1100 also may include a cooperating element 1105. The cooperating element 1105 may be a hardware device. The cooperating element 1105 may be a process that can be loaded into the memory 1104 and executed by the processor 1102 to implement various functions presented herein (in which case, for example, the cooperating element 1105 (including associated data structures) can be stored on a non-transitory computer-readable storage medium, such as a storage device or other suitable type of storage element (e.g., a magnetic drive, an optical drive, or the like)).

The computer 1100 also may include one or more input/output devices 1106. The input/output devices 1106 may include one or more of a user input device (e.g., a keyboard, a keypad, a mouse, a microphone, a camera, or the like), a user output device (e.g., a display, a speaker, or the like), one or more network communication devices or elements (e.g., an input port, an output port, a receiver, a transmitter, a transceiver, or the like), one or more storage devices (e.g., a tape drive, a floppy drive, a hard disk drive, a compact disk drive, or the like), or the like, as well as various combinations thereof.

It will be appreciated that computer 1100 may represent a general architecture and functionality suitable for implementing functional elements described herein, portions of functional elements described herein, or the like, as well as various combinations thereof. For example, computer 1100 may provide a general architecture and functionality that is suitable for implementing one or more elements presented herein, such as OLT 110 or a portion thereof (e.g., a communication element 111, a control element 115, or the like, as well as various combinations thereof), an ONU 120 or a portion thereof (e.g., a communication element 121, a control element 125, or the like, as well as various combinations thereof), a transmitter or a portion thereof (e.g., an LDPC encoder, a SERDES transmitter, an encoder controller, or the like, as well as various combinations thereof), a receiver or a portion thereof (e.g., a SERDES receiver, an LDPC decoder, a channel estimator, a decoder controller, or the like, as well as various combinations thereof), or the like, as well as various combinations thereof.

It will be appreciated that at least some of the functions presented herein may be implemented in software (e.g., via implementation of software on one or more processors, for executing on a general purpose computer (e.g., via execution by one or more processors) so as to provide a special purpose computer, and the like) and/or may be implemented in hardware (e.g., using a general purpose computer, one or more application specific integrated circuits, and/or any other hardware equivalents).

It will be appreciated that at least some of the functions presented herein may be implemented within hardware, for example, as circuitry that cooperates with the processor to perform various functions. Portions of the functions/elements described herein may be implemented as a computer program product wherein computer instructions, when processed by a computer, adapt the operation of the computer such that the methods and/or techniques described herein are invoked or otherwise provided. Instructions for invoking the various methods may be stored in fixed or removable media (e.g., non-transitory computer-readable media), transmitted via a data stream in a broadcast or other signal bearing medium, and/or stored within a memory within a computing device operating according to the instructions.

It will be appreciated that the term "or" as used herein refers to a non-exclusive "or" unless otherwise indicated (e.g., use of "or else" or "or in the alternative").

It will be appreciated that, although various embodiments which incorporate the teachings presented herein have been shown and described in detail herein, those skilled in the art can readily devise many other varied embodiments that still incorporate these teachings.

What is claimed is:

1. An apparatus, comprising:
   at least one processor; and
   at least one memory including instructions that, when executed by the at least one processor, cause the apparatus to at least:
   support communication of a message configured to cause a transmitter of a data burst to use a first forward error correction setting for encoding a first portion of the data burst and to use a second forward error correction setting for encoding a second portion of the data burst, wherein the second forward error correction setting is different than the first forward error correction setting, and wherein the message includes at least one of an indication of the first forward error correction setting or an indication of the second forward error correction setting.

2. The apparatus of claim 1, wherein the message includes one or more of:
   at least one of an indication of a location of the first portion of the data burst or a location of the second portion of the data burst;
   at least one of an indication of a length of the first portion of the data burst or a length of the second portion of the data burst; or at least one of an indication of a number of codewords of the first portion of the data burst or a number of codewords of the second portion of the data burst.

3. The apparatus of claim 1, wherein the message is configured to enable the transmitter to compute information indicative of at least one of a location of the first portion of the data burst or a location of the second portion of the data burst.

4. The apparatus of claim 1, wherein the message includes forward error correction setting control information.

5. The apparatus of claim 4, wherein the forward error correction setting control information is indicative that the first forward error correction setting is to be used for the first portion of the data burst and that the second forward error correction setting is to be used for the second portion of the data burst.

6. The apparatus of claim 4, wherein the forward error correction setting control information is configured to cause the transmitter to switch from using the first forward error correction setting to using the second forward error correction setting, wherein the message includes an indication of a location within the data burst at which the transmitter is to switch from using the first forward error correction setting to using the second forward error correction setting.

7. The apparatus of claim 4, wherein the message is included in a framing sublayer (FS) frame.

8. The apparatus of claim 1, wherein the message is a burst profile message.

9. The apparatus of claim 8, wherein the burst profile message is a Burst_Profile Physical Layer Operation and Management (PLOAM) message or an Optical Network Unit (ONU) Management and Control Interface (OMCI) message.

10. The apparatus of claim 1, wherein the first forward error correction setting is indicative of a first code rate and the second forward error correction setting is indicative of a second code rate.

11. The apparatus of claim 1, wherein the first forward error correction setting and the second forward error correction setting are based on a forward error correction parameter for a forward error correction mother code.

12. The apparatus of claim 11, wherein the forward error correction parameter for the forward error correction mother code includes at least one of an amount of puncturing for the forward error correction mother code or an amount of shortening for the forward error correction mother code.

13. The apparatus of claim 1, wherein at least one of the first forward error correction setting or the second forward error correction setting includes information to determine a new forward error correction code.

14. The apparatus of claim 1, wherein the message is configured to cause the transmitter to use a third forward error correction setting for encoding a third portion of the data burst.

15. The apparatus of claim 1, wherein the instructions, when executed by the at least one processor, cause the apparatus to at least:
support communication of the first portion of the data burst encoded based on the first forward error correction setting; and
support communication of the second portion of the data burst encoded based on the second forward error correction setting.

16. The apparatus of claim 1, wherein, to support communication of the message, the instructions, when executed by the at least one processor, cause the apparatus to at least:
receive, by the transmitter of the data burst from a receiver of the data burst or a controller, the message; or
send, by a receiver of the data burst toward the transmitter of the data burst, the message.

17. The apparatus of claim 1, wherein the transmitter includes an optical network unit (ONU) and an associated receiver includes an optical line terminal (OLT), wherein the ONU and the OLT are associated with a passive optical network (PON).

18. A non-transitory computer readable medium comprising computer program code which, when executed by an apparatus, causes the apparatus to at least:
support communication of a message configured to cause a transmitter of a data burst to use a first forward error correction setting for encoding a first portion of the data burst and to use a second forward error correction setting for encoding a second portion of the data burst, wherein the second forward error correction setting is different than the first forward error correction setting, and wherein the message includes at least one of an indication of the first forward error correction setting or an indication of the second forward error correction setting.

19. A method, comprising:
supporting communication of a message configured to cause a transmitter of a data burst to use a first forward error correction setting for encoding a first portion of the data burst and to use a second forward error correction setting for encoding a second portion of the data burst, wherein the second forward error correction setting is different than the first forward error correction setting, and wherein the message includes at least one of an indication of the first forward error correction setting or an indication of the second forward error correction setting.

* * * * *